United States Patent [19]

Kosteva et al.

[11] Patent Number: 5,870,285
[45] Date of Patent: Feb. 9, 1999

[54] ASSEMBLY MOUNTING TECHNIQUES FOR HEAT SINKS IN ELECTRONIC PACKAGING

[75] Inventors: Stephen John Kosteva, Endicott; Bahgat Ghaleb Sammakia, Newark Valley, both of N.Y.

[73] Assignee: International Business Machines Corporation, Armonk, N.Y.

[21] Appl. No.: 736,899

[22] Filed: Oct. 25, 1996

[51] Int. Cl.[6] .................................................. H05K 7/20
[52] U.S. Cl. ...................... 361/704; 165/185; 174/16.3; 257/727; 361/719
[58] Field of Search ................................ 165/80.3, 185; 174/16.3; 257/706, 707, 713, 718, 719, 727; 361/703–705, 707, 709, 717–720, 722, 807, 809, 810

[56] References Cited

U.S. PATENT DOCUMENTS

| | | | |
|---|---|---|---|
| 2,868,057 | 1/1959 | Anstett | 411/451 |
| 4,003,175 | 1/1977 | Patry | 411/456 |
| 4,521,827 | 6/1985 | Jordan | 361/386 |
| 4,658,331 | 4/1987 | Berg | 361/387 |
| 4,665,467 | 5/1987 | Speraw | 361/388 |
| 4,728,238 | 3/1988 | Chisolm | 411/456 |
| 5,019,940 | 5/1991 | Clemens | 361/719 |
| 5,384,940 | 1/1995 | Soule | 361/809 |
| 5,422,789 | 6/1995 | Fisher | 361/809 |
| 5,661,639 | 8/1997 | Furuno | 361/704 |

FOREIGN PATENT DOCUMENTS

| | | | |
|---|---|---|---|
| 0286139 | 3/1928 | United Kingdom | 411/455 |

Primary Examiner—Gerald P. Tolin
Attorney, Agent, or Firm—Douglas M. Clarkson

[57] ABSTRACT

An assembly support mount includes at least two flexible, retention posts spaced apart with ends to engage a heat sink frictionally to support the heat sink relative to an electronic device. The flexible retention posts are attached to a substrate without the need for holes in the substrate and extend past a heat generating device into openings in a heat sink where they are attached by any number of means, preferably by frictionally engaging the openings in the heat sink.

5 Claims, 5 Drawing Sheets

ASSEMBLY MOUNTING TECHNIQUES FOR HEAT SINKS IN ELECTRONIC PACKAGING

FIELD OF THE INVENTION

The present invention, generally, relates to the field of electronic packaging and, more particularly, to techniques for mounting a heat sink in an electronic module package.

Various components in the field of microelectronic module packaging are becoming smaller and smaller, but at the same time, problems relating to the dissipation of heat are becoming anything but smaller. The size of the heat sinks needed to cool components in today's microelectronic industry, compared to component sizes, make them more difficult to remove during module rework.

BACKGROUND OF THE INVENTION

In the microelectronic field, the increase in the density of the circuits involving the smaller and smaller component sizes creates a need for more and more input/output lines, all of which produces ever increasing heat dissipation problems. If cost was not an important factor, these problems might be dealt with more readily, but reducing the assembly cost is equally important.

U.S. Pat. No. 5,437,561 to Earl et al. describes a connector for attaching a heat sink to a circuit board by a pair of spring-biased legs on projections to expand the legs to engage the opposite side of holes in a circuit board.

U.S. Pat. No. 5,384,940 to Soule et al. describes a device for attaching a heat sink by a pin with a point that compresses as it passes through a hole in a circuit board and expands on the opposite side to hold an electronic package between the heat sink and the circuit board.

U.S. Pat. No. 5,304,735 to Earl et al. describes a heat sink for attaching to a pin grid array by clips that are compressed to engage grooves along opposite sides.

U.S. Pat. No. 5,040,096 to Churchill et al. describes a clip to hold a heat sink against a semiconductor by projecting over an arcuate section.

U.S. Pat. No. 4,933,746 to King describes a clip with three legs fitting through slots in a heat sink for attaching it to a semiconductor.

U.S. Pat. No. 4,679,118 to Johnson et al. describes a heat-conducting cap holding a chip package mated with a multi-pin and socket array.

U.S. Pat. No. 4,544,942 to McCarthy describes a heat sink that is fitted on solid state devices to maintain thermal conditions with studs projecting through a circuit board.

A U.K. patent application No. 2,198,888 by Moore describes an assembly including a semiconductor device on a platform that is in thermal contact with a heat sink by means of a supporting stud.

OBJECTS AND SUMMARY OF THE INVENTION

It is a principal object of the present invention to provide an apparatus to hold a heat sink relative to an electronic device.

It is also an important object of the present invention to provide a heat sink support apparatus that is functionally effective while being adaptable to less costly manufacture.

Another object of the invention is to provide a heat sink support that is adaptable to control the weight applied against an electronic component.

Briefly, a heat sink support apparatus in accordance with the present invention includes at least two flexible members extending in a spaced apart relationship from a surface of a substrate, each of the members being adaptable to frictionally engage a heat sink. The substrate includes an electronic component that generates heat to be coupled thermally to the heat sink, and the flexible members support the heat sink to bear with a predetermined force against the electronic component, avoiding the necessity of apertures, or the like, in the substrate.

The above, other and further objects, features and advantages of the present invention will become more readily apparent from the following detailed description, but the invention is not limited to the details of the description. Rather, it is understood that all changes and modifications that come within the scope and spirit of the appended claims are included in the present invention.

DETAILED DESCRIPTION OF THE INVENTION

Figure 1:
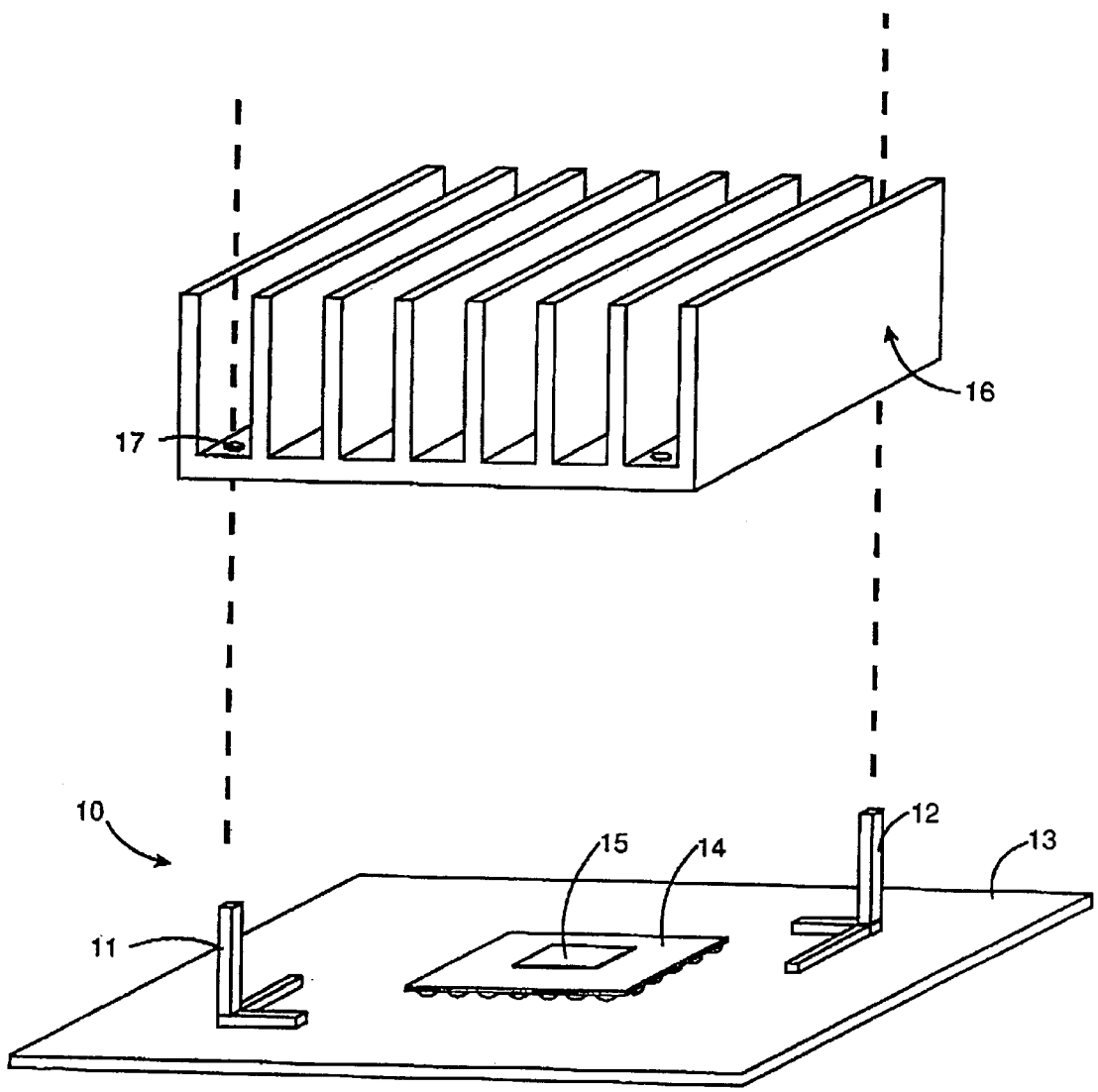
FIG. 1 illustrates a presently preferred form of the invention that includes features as an aid to the description.

In FIG. 1 of the drawings, ratchet retention posts 10 are identified further by the reference numerals 11 and 12. The actual structure of the posts will be described in more detail presently infra, the significant feature to be noted here is that the ratchet retention posts 11 and 12 do not require holes or other openings in a substrate 13.

In accordance with the invention, the number of retention posts and their location are determined by such factors as the size, the weight and/or the thermal conductivity of the heat sink.

Here, for the purposes of this description, the term "substrate" means a member that supports a component 14 on which is mounted a device 15 that generates heat to be conducted away and into the atmosphere. A heat sink 16 has holes 17 located to match and receive the spaced retention posts 11 and 12.

The arrangement illustrated in FIG. 1 does not require holes in the substrate 13. The retention posts 11 and 12 can be affixed to the substrate 13 either directly or by means of an intermediate frame or member by glue, screws (up from the under side as seen in this view) or be metalized and attached by soldering, welding or the like.

Further, the retention posts need not be any particular shape, design or configuration. They must, however, be attached in a fixed, appropriate manner, as described hereinabove, to the substrate in a location to match and be received in holes or other suitable openings in the heat sink.

In accordance with an important aspect of the invention, using the retention posts, such as the posts 11 and 12, the heat sink 16 is supported in a more controlled position relative to the component 14 and/or the device 15. This feature can be important because there are many components that have delicate wiring and other sensitive circuit elements that can experience damage if too much pressure is brought to bear on them.

By using retention posts according to the invention, the heat sink is supported with a predetermined, desired force against the device on which it is pressed. Therefore, it may be helpful to describe the configuration and the arrangement of the retention posts in more detail.

Figure 2:
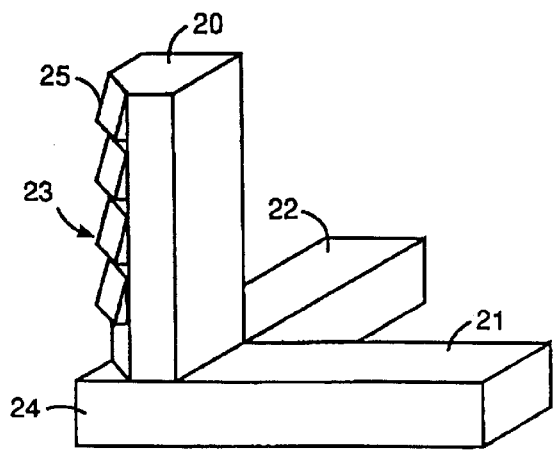
FIG. 2 is an illustration of one form of a ratchet retention post in accordance with the invention.

First, the configuration of the retention posts: Referring to FIG. 2 of the drawings, a retention post 20 is fixedly attached to members 21 and 22 extending in a relatively short distance at an angle that usually is 90 degrees. The distance these members extend is variable depending on such factors as the magnitude of a force that will be needed to flex the posts toward each other to attach and/or to release a heat sink. The flexibility of the posts will be described in more detail hereinafter.

The post 20 is five sided in order to present a flat surface 23 in the general direction of the point 24 of intersection between the members 21 and 22. It is the surface 23 that has a predetermined number of ratchets 25, and the spacing between adjacent ratchets can match the thickness of the base of the heat sink with the openings 17, FIG. 1, arranged to receive the post.

The members 21 and 22 are used, according to the invention, to attach the post 20 in a correct location on the substrate 13, FIG. 1, to support the heat sink 16 in a more controlled manner on and against the component 14 and the device 15. The pressure between the heat sink 16 and the device 15 is one of several factors that determines the effectiveness of thermal transfer.

There exists already several effective interface materials that can be used, if desired, between the device 15 and the heat sink 16. Such materials are available commercially as greases, low modulas epoxies, elastomeric pads, etc. and are known to increase thermal conductivity between contiguous members.

Figure 3:
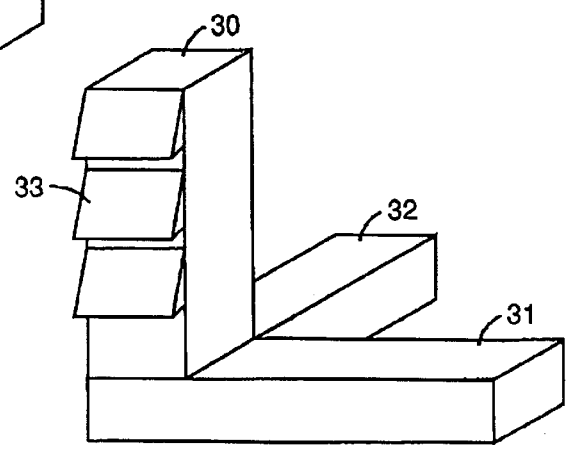
FIG. 3 is a modification of the ratchet retention post as an aid to the description to follow.

Referring to FIG. 3 of the drawings, a retention post 30 is four sided, or square, and it is fixedly attached at the intersection of two members 31 and 32. The number of ratchets 33 are arranged on one of the flat surfaces of the four sided post 30, and in this view, the ratchet configuration is different from that viewed FIG. 2 in order to illustrate that various arrangements are within the present invention.

Figure 4:
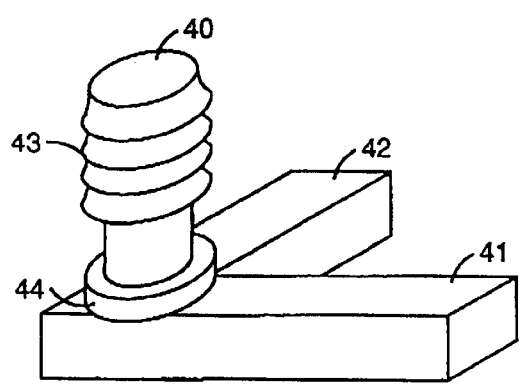
FIG. 4 is an illustration of one modification to the ratchet retention post assembly of the invention.

As a further example, FIG. 4 illustrates yet another variation in the configuration of a retention post in accordance with the invention. Here, a retention post 40 is shown as circular, or round, and this post is fixedly attached to two members 41 and 42, as described herein, supra.

The retention post 40 is formed with several ratchets 43 that extend around the post but function in a manner similar to those described hereinabove. The number and the spacing of the ratchets 43 is a matter of design requirements, as readily understood.

One important difference, however, in the configuration shown in FIG. 4 is that the round retention post 40 has a flange 44 that extends from a point at or near its base, so that the post can be affixed directly the surface of a substrate 13, FIG. 1, instead of to the members 41 and 42. The flange 44 is significant because the post is contemplated to be relatively thin since it must also be flexible.

The material from which a retention post is formed according to the invention can be metal or plastic. A requirement, however, is that each retention post should be flexible, in that to attach and to remove a heat sink, the retention posts are flexed slightly in a direction toward each other, thereby releasing the frictional engagement between the ratchets and the heat sink.

Each post configuration illustrated in FIGS. 2, 3 and 4 must be flexible, as described hereinabove, but may be formed of any material that will permit this characteristic of flexibility. The retention posts grip the heat sink by friction, which is released by flexing them toward each other, and a purpose of the ratchets is to increase this friction.

Second, the arrangement of the retention posts: FIG. 1 also illustrates an arrangement of the retention posts 10 according to one aspect of the present invention. In other words, when it is determined that two posts are needed to retain the heat sink 16, then the retention posts 10 are located as illustrated in FIG. 1 of the drawings.

The configuration of the retention posts 10 can be selected from those illustrated in either FIG. 2, FIG. 3 or FIG. 4, because each of these will grip the edge of a hole, or the like opening, in the heat sink 16 with a force sufficient to maintain a thermal transferring relationship with the device 15, FIG. 1.

Figure 5:
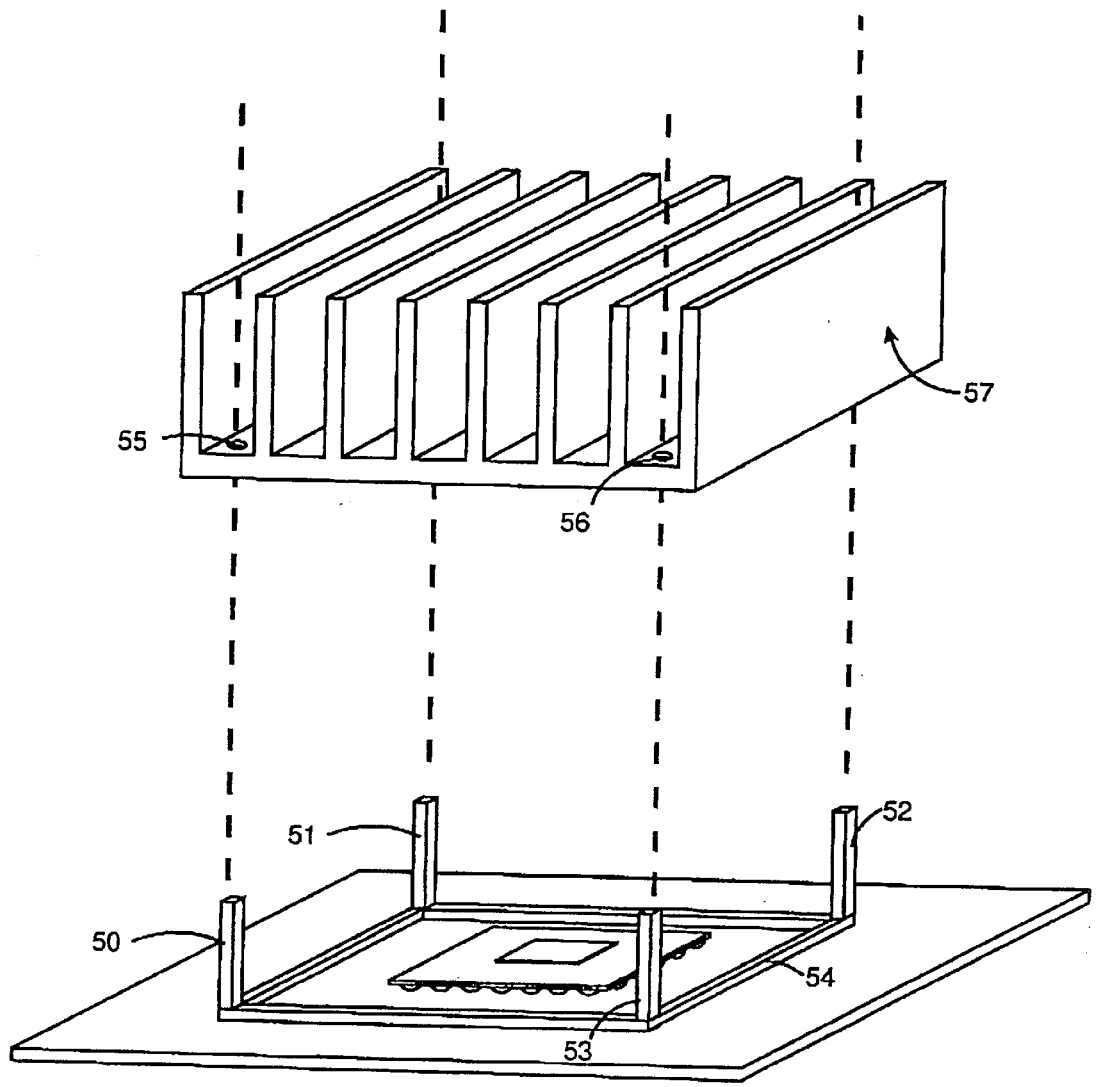
FIG. 5 is a modification of the present invention illustrating the use of a multiple post assembly.

On the other hand, if it is determined that four posts are necessary in order to increase the retention force or to even the retention force to a less amount because of a more delicate condition concerning the device 15 or its surrounding circuitry, then a configuration of the retention posts is as illustrated in FIG. 5 of the drawings.

In FIG. 5, four posts 50, 51, 52 and 53 are shown located at the corners of a four-sided, rectangular frame 54. The individual posts may have a configuration as described hereinabove, or any combination of these configurations, that may be indicated by unique circumstances of a particular situation.

Each retention post, for example, the post 50, et al., will fit the holes, apertures, slots, openings, or the like, indicated by the numerals 55 and 56, in a heat sink 57. Also in accordance with the present invention, each retention post, regardless of its specific configuration, will be received in its hole in the heat sink with a frictional fit sufficient to achieve the desired transfer of heat. It may be necessary, in some instances, to extend each post away from each other slightly to increase its gripping force further.

Figure 6:
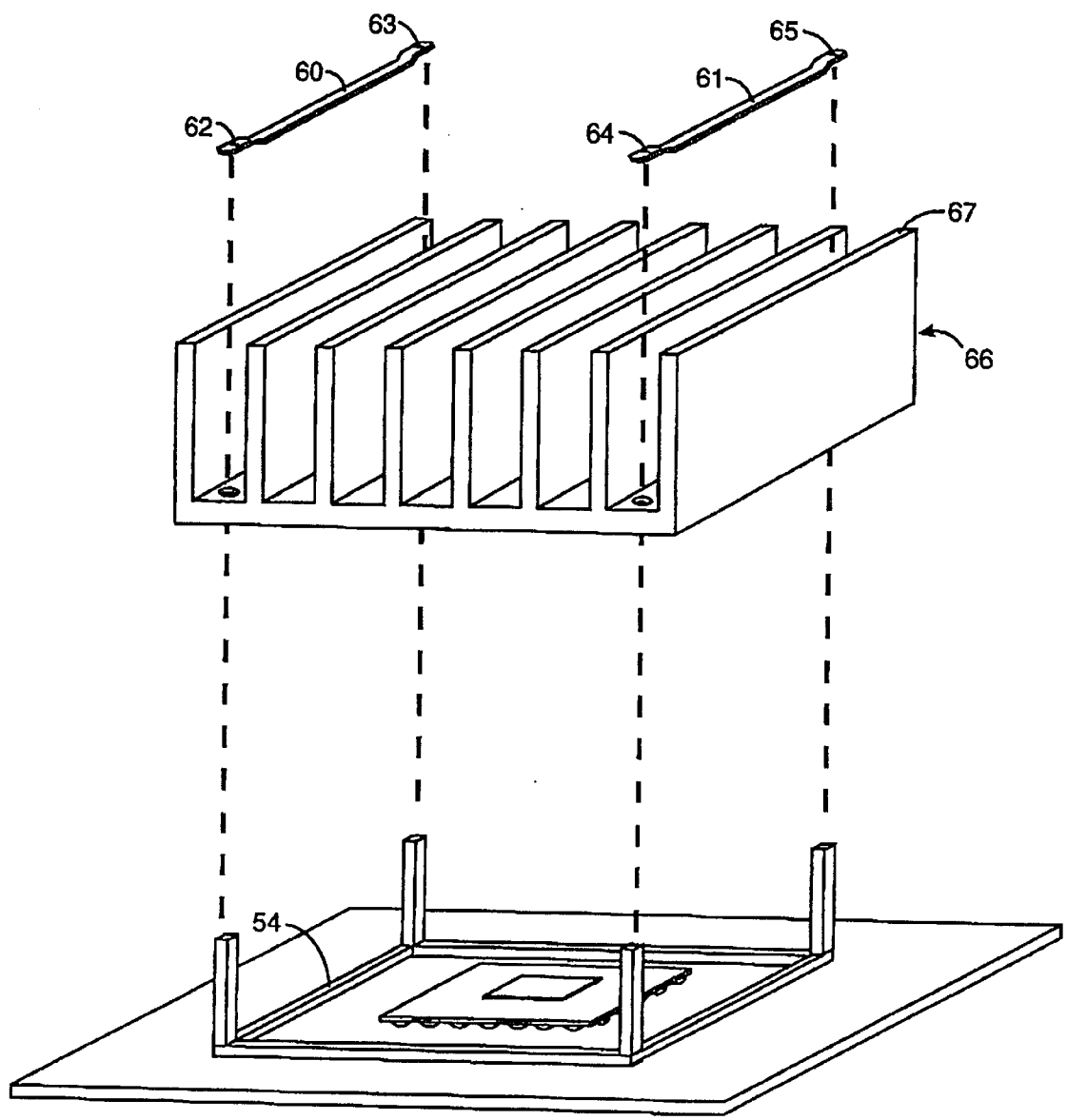
FIG. 6 is an illustration of a further modification to which the invention is adaptable.

An arrangement with the retention posts of the invention permits a higher degree of control over the force applied between the heat sink and the device with heat to be conducted thermally. For example, as illustrated best in FIG. 6 of the drawings, when either more force is needed, or when holes of any type in the heat sink are to be avoided for any of a number of reasons, bars 60 and 61 have holes 62, 63, 64 and 65 located near each end to receive a retention post.

In this manner, the bars are located across the heat sink 66, between fins 67, and held frictionally by a respective retention post, as described previously hereinabove. The use of the four-sided, rectangular frame 54, FIG. 5, is preferred here to maintain good thermal contact and control of the applied pressure.

However, there are instances where a frame, such as the frame 54 of FIG. 5, could be too confining, i.e., when a component is of a size that would not fit within a frame or other instances. This is to illustrate that the retention posts of the present invention are not limited to use with a frame, but they may be fixed to the substrate directly.

Figure 7:
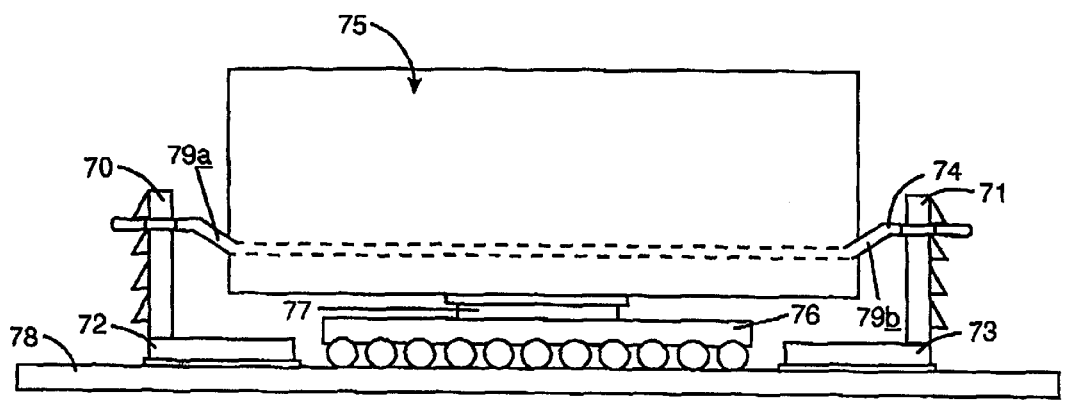
FIG. 7 illustrates a further modification to which the present invention is adaptable.

A modification as illustrated in FIG. 7 is contemplated by the invention. Referring now to FIG. 7 of the drawings, retention posts 70 and 71 are attached to members 72 and 73. The retention posts 70 and 71 can be just two of several, as described above, or they can be centered.

At least one bar 74 is formed with a hole at each end to fit the posts 70 and 71. The bar 74 has a bend at each end so that the center portion can bear against a heat sink 75 in the position illustrated in this view or when it is inverted when a component 76 and a device 77 are larger.

The arrangement illustrated in FIG. 7 avoids a need for holes or any openings whatsoever in the heat sink 75 as well as in the substrate 78. The bends in the bar 74 are identified in this view by the reference numerals 79a and 79b.

The friction retention posts of the present invention offer a much more flexible arrangement for packaging of these electronic components and devices. For example, FIG. 8 illustrates a smaller component and device combination and a larger heat sink.

Figure 8:
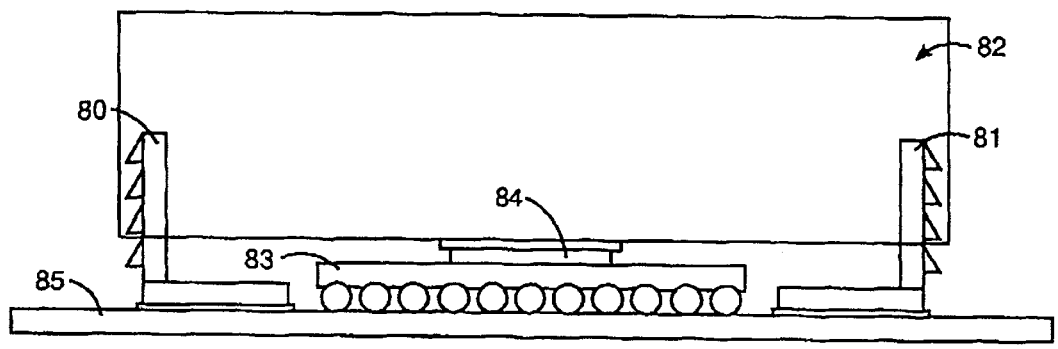
FIG. 8 illustrates a still further modification to which the present invention is adaptable.

In FIG. 8, the retention posts 80 and 81 are received within holes (not visible) in the base of a heat sink 82. These posts are either the only ones, in which case they will be arranged as in FIG. 1, or they are two of several that can be arranged in any desired pattern, such as symmetrical, one at each corner of the heat sink 82.

The view illustrated by FIG. 8 shows that even with a component 83 that is smaller laterally, a device 84 affixed to it can be larger, or alternatively, the device 84 can generate more heat that requires a larger heat sink 82 to maintain the temperature of the package within acceptable levels. As described previously in connection with other figures, the device 84 is affixed to a component 83 which, in turn, is affixed to a substrate 85.

While the present invention has been described in substantial detail in connection with the presently preferred embodiment and several presently preferred modifications thereof, still other and further forms, features and modifications will occur to those that are skilled in this art based upon the present disclosure.

Accordingly, it is understood that the present invention is not limited by the description hereinabove but rather is defined by the appended claims.

What is claimed is:

1. An assembly mount supporting a heat sink relative to a surface of an electronic device on a substrate to enable heat to pass from said device to said heat sink, comprising:

a plurality of flexible, retention post means affixed to members secured to a surface of the substrate at a predetermined angle;

said plurality of post means are formed of a plastic material with sufficient metallic particles to admit attachment by soldering:

each of said retention post means having two ends, one of said ends being removably affixed to said surface of said substrate, and the other of said ends having means frictionally engaging and supporting the heat sink;

whereby said heat sink is supported in a close, heat transferring position relative to said electronic device.

2. An assembly mount as defined by claim 1 wherein said surface of said electronic device includes an interface material between it and said heat sink to aid in the transfer of heat.

3. An assembly mount as defined by claim 1 wherein said electronic device includes a module with at least one chip.

4. An assembly mount as defined by claim 1 wherein said flexible, retention post means are removably attached to separate members that are secured to said surface of said substrate.

5. An assembly mount as defined by claim 1 wherein said removably affixed flexible, retention post means includes a generally rectangular member removably affixed to said surface of said substrate, said flexible, retention post means are four in number, said four flexible, retention post means are secured by soldering to said generally rectangular member at said one end, and the other fitting within openings in said heat sink that match each of said four flexible, retention post means.

* * * * *